(12) United States Patent
Plaze et al.

(10) Patent No.: US 9,755,586 B2
(45) Date of Patent: Sep. 5, 2017

(54) RADIOFREQUENCY POWER LIMITER, AND ASSOCIATED RADIOFREQUENCY EMITTER AND/OR RECEIVER CHAIN AND LOW-NOISE AMPLIFYING STAGE

(71) Applicant: Thales, Neuilly sur Seine (FR)

(72) Inventors: Jean-Philippe Plaze, Elancourt (FR); Vincent Petit, Elancourt (FR); Benoît Mallet-Guy, Elancourt (FR)

(73) Assignee: THALES, Neuilly sur Seine (FR)

( * ) Notice: Subject to any disclaimer, the term of this patent is extended or adjusted under 35 U.S.C. 154(b) by 0 days.

(21) Appl. No.: 15/035,561

(22) PCT Filed: Nov. 18, 2014

(86) PCT No.: PCT/EP2014/074931
§ 371 (c)(1),
(2) Date: May 10, 2016

(87) PCT Pub. No.: WO2015/071495
PCT Pub. Date: May 21, 2015

(65) Prior Publication Data
US 2016/0294335 A1 Oct. 6, 2016

(30) Foreign Application Priority Data
Nov. 18, 2013 (FR) ...................... 13 02646

(51) Int. Cl.
*H03F 1/52* (2006.01)
*H03F 3/19* (2006.01)
*H03G 7/00* (2006.01)
*H03G 11/00* (2006.01)
*H03G 11/02* (2006.01)
*H03G 11/06* (2006.01)

(52) U.S. Cl.
CPC ................. *H03F 1/52* (2013.01); *H03F 3/19* (2013.01); *H03G 7/00* (2013.01); *H03G 11/00* (2013.01); *H03G 11/002* (2013.01); *H03G 11/02* (2013.01); *H03G 11/06* (2013.01); *H03F 2200/211* (2013.01); *H03F 2200/294* (2013.01); *H03F 2200/444* (2013.01); *H03F 2200/451* (2013.01)

(58) Field of Classification Search
CPC .............. H03F 1/52; H03F 1/523; H02H 9/02
USPC ............... 330/207 P, 298; 327/309, 313, 314
See application file for complete search history.

(56) References Cited

U.S. PATENT DOCUMENTS 6,747,484 B1    6/2004  Adlerstein et al.
2012/0281325 A1* 11/2012 Reber ..................... H03F 1/523
                                                   361/57

FOREIGN PATENT DOCUMENTS

WO      00/64047 A1    10/2010

OTHER PUBLICATIONS

French Search Report dated Oct. 1, 2014 issued in corresponding French Patent Application No. 1302646.
(Continued)

*Primary Examiner* — Steven J Mottola
(74) *Attorney, Agent, or Firm* — Troutman Sanders LLP

(57) ABSTRACT

This radiofrequency power limiter includes at least one transistor, a drain of the transistor being directly connected to a mesh connecting an input to an output of the limiter, a source of the transistor being connected to a common reference potential, and a gate of the transistor being connected to a common control potential. The transistor is not biased between its drain and its source during operation of the limiter.

11 Claims, 5 Drawing Sheets

(56) References Cited

OTHER PUBLICATIONS

International Search Report dated Feb. 5, 2015 issued in corresponding PCT International Application No. PCT/EP2014/074931.

* cited by examiner

RADIOFREQUENCY POWER LIMITER, AND ASSOCIATED RADIOFREQUENCY EMITTER AND/OR RECEIVER CHAIN AND LOW-NOISE AMPLIFYING STAGE

CROSS-REFERENCE TO RELATED APPLICATIONS

This application is the U.S. National Phase of International Patent Application Serial No. PCT/EP2014/074931, filed Nov. 18, 2014, which claims priority to French Patent Application No. 1302646, filed November 18, 2013, both of which are herein incorporated by reference in their entireties.

FIELD OF THE INVENTION

The present invention relates to radiofrequency (RF in the following) power limiters.

BACKGROUND

As schematically illustrated in FIG. 1, a limiter 10 is generally used in a receiver chain 1, downstream from a receiving RF antenna 20 and upstream from an amplification stage 30 and a processing stage 40. The amplification stage 30 includes at the input, a low noise amplifier 32, a so called LNA (low noise amplifier). The function of the limiter is to protect the LNA amplifier from high power signals received by the antenna.

Such a limiter is also used downstream from an LNA amplifier robust to high power signals, in order to protect the downstream portion of the receiver chain, for example components of the processing stage which would be sensitive to too high power levels, such as coders.

More generally, such a limiter is used in any RF transmission/reception chain requiring, in one point or in another, a limitation of the maximum power delivered at the input of a sensitive component.

Presently, limiters are generally made from PIN diodes, as the latter provide good power handling.

According to a first embodiment of a limiter of the state of the art, the PIN diodes are placed in a head-to-tail configuration. In FIG. 2, the limiter 100 includes two pairs of diodes 102, 104 and 112, 114, the diodes of each pair being placed head-to-tail. With such a configuration it is possible to clip the positive half-alternation and the negative half-alternation of an input signal, beyond a power threshold P0.

According to a second embodiment of a limiter of the state of the art, the PIN diodes are placed in parallel. In FIG. 3, the limiter 200 includes three diodes 202, 204, 206 in parallel. Such a configuration gives the possibility of clipping the input signal from a power threshold P0.

The threshold P0 for triggering the limiter is mainly related to the type of PIN diodes used and to their direct current (DC) characteristics. For example, in FIG. 4 representing the output power Pout of the limiter 100 versus the input power PIN, the threshold P0 is of about 14.75 dBm.

However, the threshold P0 cannot be adjusted. This lack of reconfigurability of a limiter does not allow production of a standard limiter and its use in different applications, operating in the same pass band.

SUMMARY

Therefore the object of the invention is to overcome the aforementioned problem, notably by proposing a reconfigurable limiter.

For this, the object of the invention is a radiofrequency power limiter, characterized in that it includes at least one transistor, a drain of said or each transistor being directly connected to a mesh connecting an input and an output of the limiter, a source of said or each transistor being connected to a common reference potential, and a gate of said or each transistor being connected to a common control potential, said or each transistor being non-biased between its drain and its source during the operation of the limiter.

According to particular embodiments, the limiter includes one or several of the following features, taken individually or according to all the technically possible combinations:

it includes at least first and second transistors, and in which the mesh connecting the input and the output of the limiter includes, between the connection nodes of the drains of the first and second transistors, an intermediate inductor;

the mesh connecting the input to the output of the limiter includes an input inductor between the input of the limiter and a connection node of the drain of an upstream transistor, and/or an output inductor between a connection node of the drain of a downstream transistor from among said at least one transistor and the output of the limiter;

the gate of said or each transistor is connected to the common control potential (Voff), via a protective resistor;

the drain of said or each transistor is directly connected to the mesh connecting the input and the output of the limiter;

the source of said or each transistor is directly connected to the reference potential;

the control potential corresponds to a first terminal of a voltage source, the other terminal of the voltage source being connected to said reference potential;

the voltage source is controlled by a suitable control signal;

said or each transistor is a field effect transistor;

an electric equivalent in a low power operating range is given by a transmission line;

it is made in a power technology, notably a technology based on gallium nitride.

The object of the invention is also a component of the low noise amplifier type, characterized in that it integrates a limiter as defined above.

The invention further relates to a chain for transmitting or receiving radiofrequency signals, characterized in that it includes a limiter as defined above.

BRIEF DESCRIPTION OF THE DRAWINGS

The invention and advantages thereof will be better understood upon reading the description which follows of an exemplary embodiment, only given as an illustration and not as a limitation, and made with reference to the appended drawings wherein.

DETAILED DESCRIPTION

Figure 5:
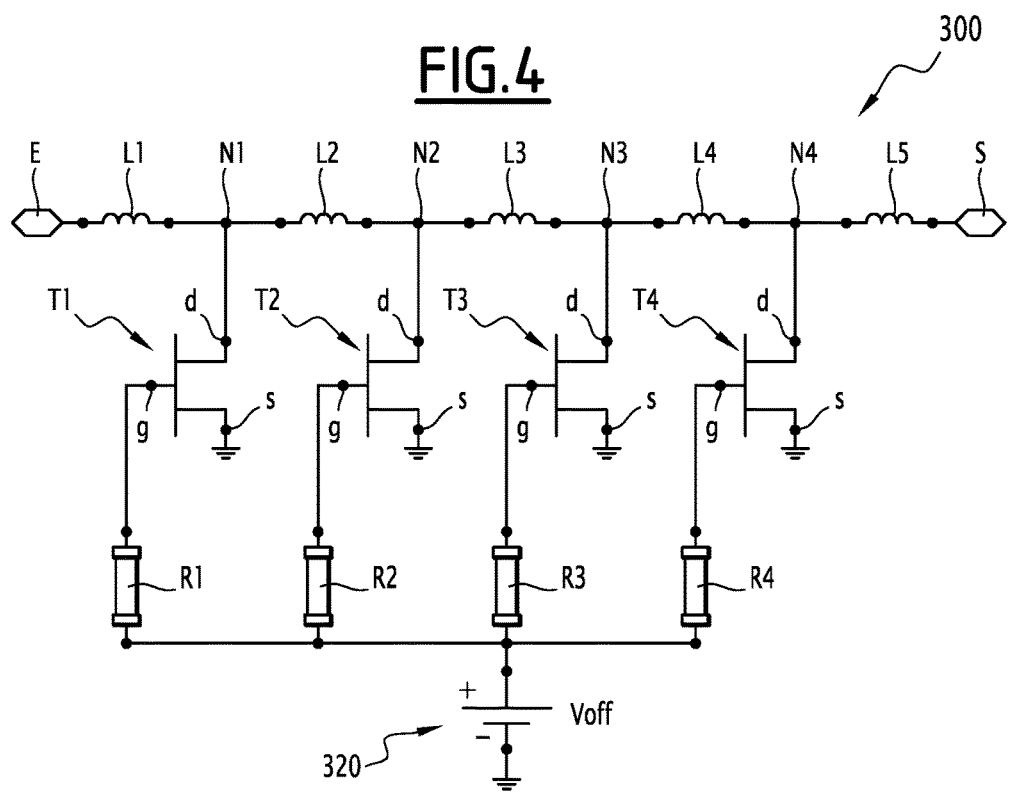
FIG. 5 is a block diagram of a cold FET limiter in GaN technology according to the invention.

An preferential embodiment of a radiofrequency power limiter according to the invention will be shown with reference to FIG. 5.

In this figure, the power limiter RF 300 is made from a plurality of transistors Ti.

These are preferably field effect transistors FET. If another type of transistor is used, the correspondence between source, drain and gate of a FET transistor to the corresponding terminals of this other type of transistor is obvious for one skilled in the art.

In FIG. 5, the limiter 300 includes four transistors Ti identical with each other.

The transistors are placed in parallel between the input E and the output S of the limiter 300.

More specifically, the mesh connecting the input E to the output S includes first, second, third and fourth nodes, Ni.

The drain d of the $i^{th}$ transistor Ti is connected to the $i^{th}$ node Ni, while the source s of the $i^{th}$ transistor Ti is connected to a reference potential, for example to ground.

The transistors Ti are said to be cold transistors, i.e. they are not biased between their drain d and their source s during the operation of the limiter 300.

The limiter 300 also includes a plurality of inductors Li (also called selfs). They are placed in series, relatively to each other, in the mesh connecting the input E to the output S. In FIG. 5, five inductors Li are used: the first L1 between the input E and the first node N1; the second L2, between the first node N1 and the second node N2; the third L3, between the second node N2 and the third node N3; the fourth L4, between the third node N3 and the fourth node N4; and the fifth L5, between the fourth node N4 and the output S.

The impedances Li for example have the same value L.

It should be noted that the presence of the first and fifth inductors L1 and L5 is optional for taking into account cable wires connected to the input E and to the output S of the limiter 300, these cable wires may be assimilated to inductors.

The gate g of the $i^{th}$ transistor Ti is connected, via a protection resistor Ri, to a biased potential (or control voltage) Voff.

The resistors Ri have an identical value R.

A voltage source 320 gives the possibility of establishing the value of the potential difference between the biased potential and the reference potential, i.e. between the gate g and the source s of each transistor Ti.

In the linear operating range of the limiter 300, the biased potential Voff is selected and applied so as to block the transistors Ti.

Thus, in the linear operating range of the limiter 300, the transistors Ti, mounted in parallel, are in a first approximation equivalent to capacitors Ci.

The equivalent capacitances Ci are identical with each other.

Figure 6:
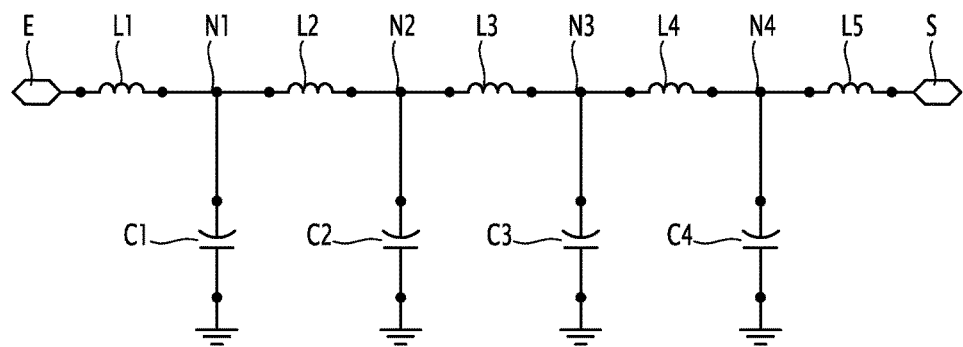
FIG. 6 is an equivalent diagram of the limiter of FIG. 5 in a linear operating range.

Thus, in the linear operating range of the limiter 300, the latter is equivalent to a transmission line. Such an electric equivalent of the limiter of FIG. 5 is illustrated in FIG. 6.

Figure 7:
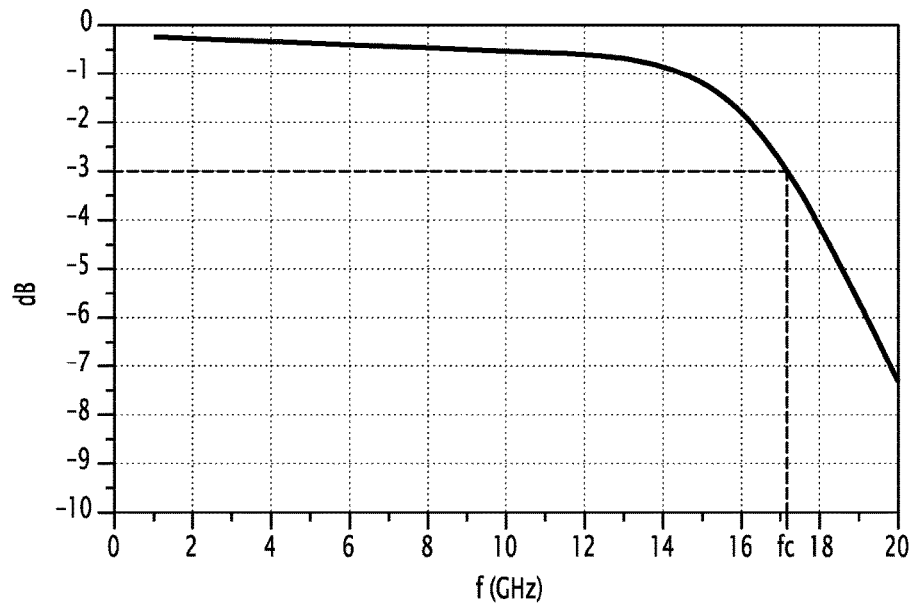
FIG. 7 is a graph of the transmission response of the limiter of FIG. 5 in a linear operating range.

In FIG. 7, the linear operating range of the limiter 300 is given by the range of frequencies having a gain between 0 and −3 dB. The linear operating range extends as far as a characteristic cutoff frequency fc.

The cutoff frequency fc of the limiter is related to the equivalent capacitances (Ci=C) as well as to the inductances (Li=L), so to the relationship $$fc = \frac{1}{\sqrt{L/C}}.$$

The inductances (Li=L) are themselves selected according to the equivalent capacitances (Ci=C) in order to obtain the equivalence of a transmission line with a characteristic impedance of Zc by using the relationship Zc=√L/C (Zc being generally selected to be equal to 50Ω). The selection of the transistor, and therefore of its equivalent capacitance, therefore allows definition of the cutoff frequency of the limiter.

Such a limiter since it is equivalent to a transmission line gives the possibility of limiting the transmission losses inside the linear operating range of the limiter (i.e. outside the power limitation range, below the threshold P0).

Figure 8:
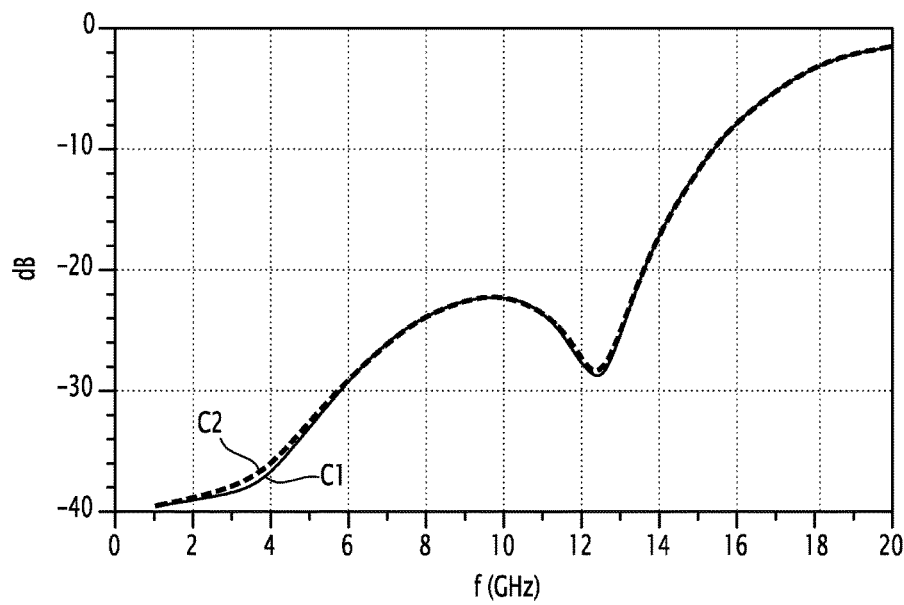
FIG. 8 is a graph of reflection coefficients at the input and at the output of the limiter of FIG. 5 in a linear operating range.

Such a limiter also has good power matching at the input (curve C1 in FIG. 8) and at the output (curve C2 in FIG. 8), over an extended frequency range.

The power operating range of the limiter 300 is adjustable by means of the value of the control voltage Voff applied by the voltage source 320.

Figure 1:
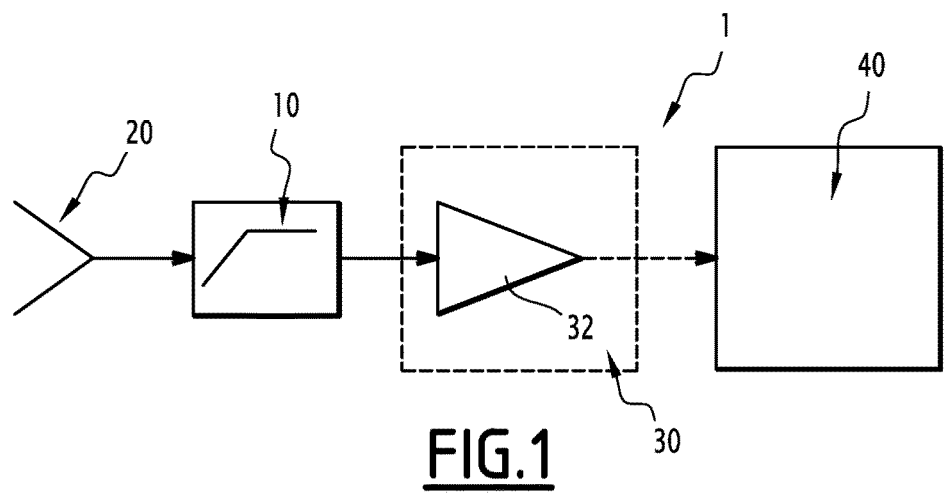
FIG. 1 schematically represents an RF reception chain.
Figure 2:
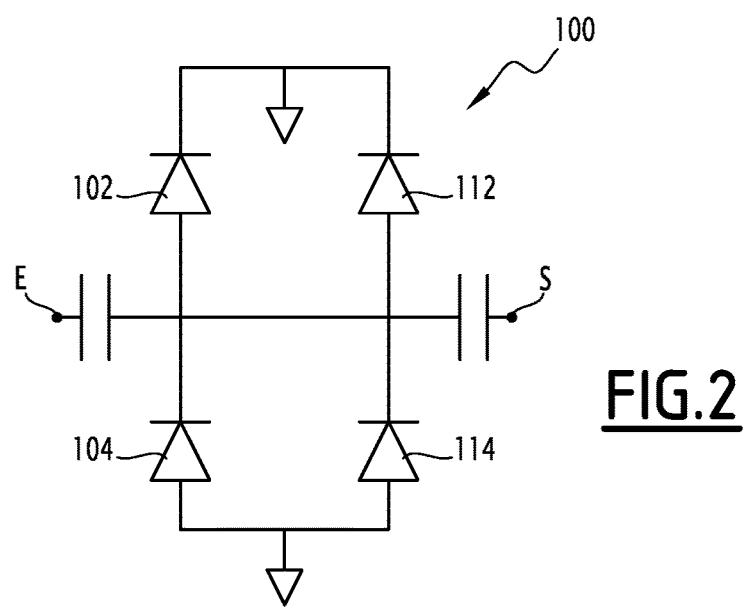
FIG. 2 is a block diagram of a limiter with head-to-tail diodes according to the state of the art.
Figure 3:
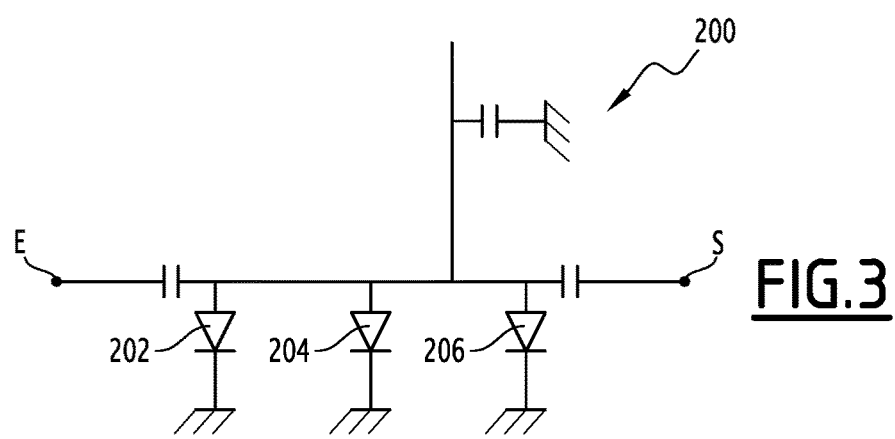
FIG. 3 is a block diagram of a limiter with diodes in parallel according to the state of the art.
Figure 4:
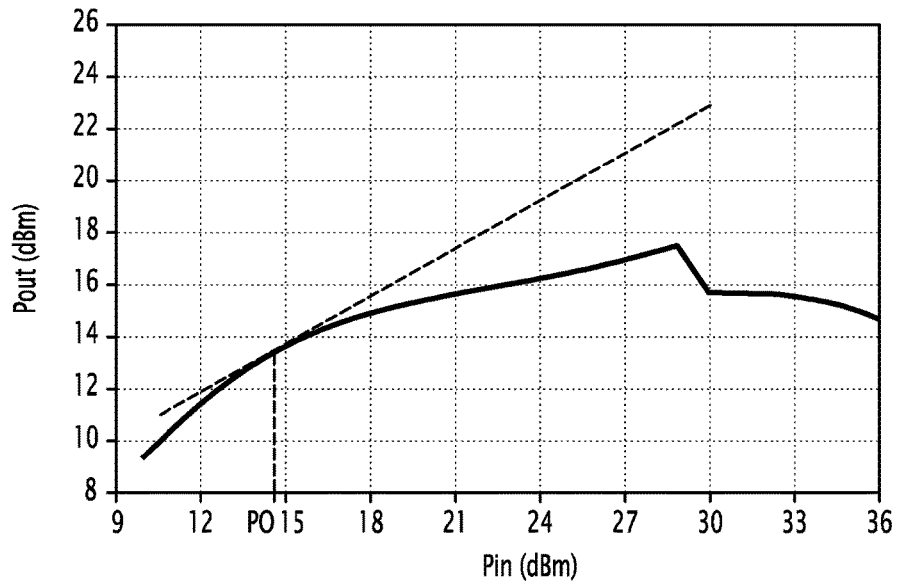
FIG. 4 is a graph illustrating the output power versus the input power at 10 GHz for the limiter with head-to-tail diodes of FIG. 2.
Figure 9:
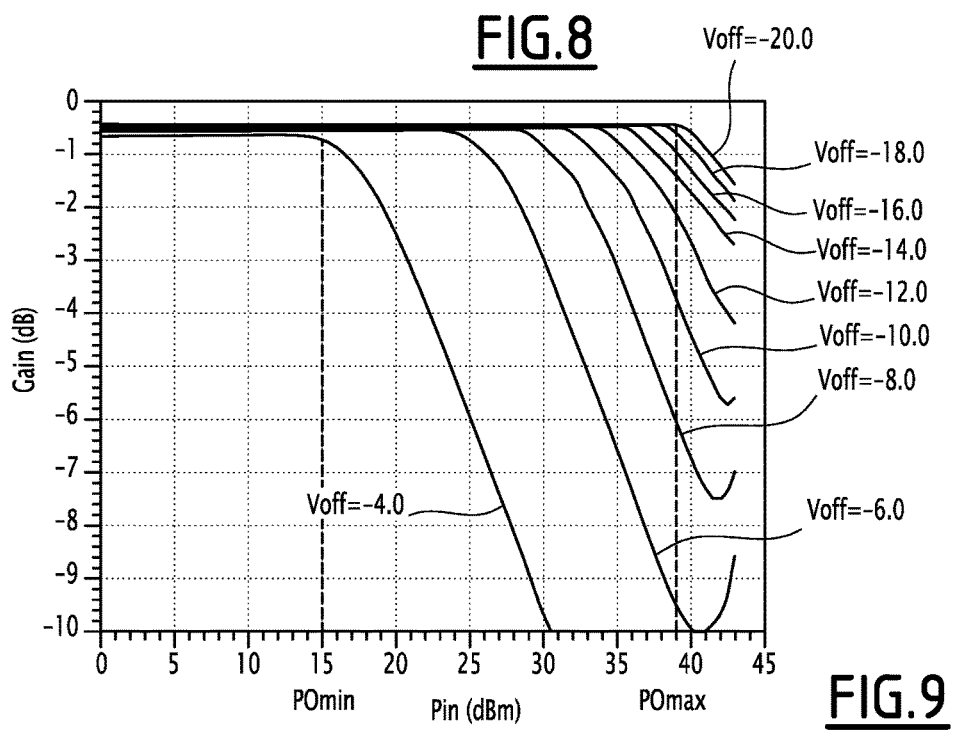
FIG. 9 is a graph of the gain versus the input power for a frequency of 10 GHz for different values of the control potential of the limiter of FIG. 5; and, FIG. 10 is a graph of the output power versus the input power for a frequency of 10 GHz for different values of the control potential of the limiter of FIG. 5.
Figure 10:
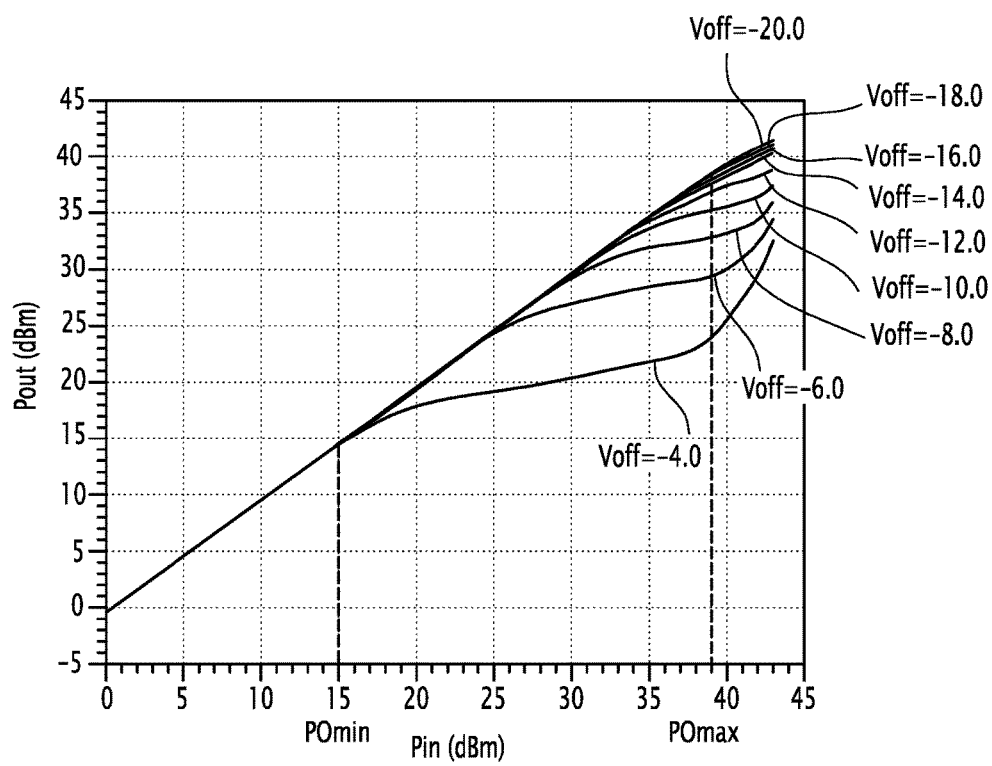

This is illustrated by FIGS. 9 and 10, which respectively show the power gain of the limiter 300 versus the input power Pin, or in order to allow a comparison with FIG. 4 of the prior art, the output power Pout versus the input power Pin.

FIG. 9 thus shows the time-dependent change in the gain of the limiter 300 versus the input power Pin of an RF signal at 10 GHz, for a control voltage Voff applied between the gate g and the source s of the cold FET transistors comprised between −20 V and −4 V.

FIG. 10 shows the time-dependent change in the RF power Pout at the output of the limiter 300 versus the input power Pin of an RF signal at 10 GHz, for a control voltage Voff applied between the gate g and the source s of the cold FET transistors comprised between −20 V and −4 V.

The power low level losses (Pin less than P0) vary very little according to the control voltage Voff (of the order of 0.2 dB).

On the other hand, the control voltage Voff gives the possibility of changing the threshold P0 for triggering the limiter 300 over an extended range of values, between P0min=+15 dBm (for Voff=−4 V) and P0max=39 dBm (for Voff=−20 V).

The adaptation of the voltage delivered by the source 320 thus allows reconfiguration of the limiter 300 according to its use. This may be a fixed voltage source, selected during the manufacturing of the receiver chain, or a voltage source which may be modified, according to an adapted control signal.

Advantageously, the diodes on the basis of which are built the limiters of the prior art are not always available in technologies of integrated circuits of the MMIC ("Monolithic Microwave Integrated Circuit") type. Consequently, the possibility of integration of limiters of the prior art with other components made in MMIC technology (in particular with low noise amplifiers LNA) are limited.

On the other hand, the solution shown above allows integration in MMIC technology. Therefore it is for example possible to integrate, on a same circuit, a limiter and a low noise amplifier (LNA). The thereby obtained component allows savings in space and also making a RF receiver chain having increased compactness.

The limiter shown above may be made in a power technology, preferably power MMIC technology. For example, the selection of an MMIC technology based on Gallium Nitride (GaN) gives the possibility of producing a limiter having good power handling.

The invention claimed is:

1. A radiofrequency power limiter comprises:
   at least one transistor,
   a drain of said transistor being directly connected to a mesh connecting an input and an output of the limiter,
   a source of said transistor being connected to a common reference potential, and
   a gate of said transistor being connected to a common control potential (Voff), said transistor not being biased between its drain and its source during the operation of the limiter,
   wherein the radiofrequency power limiter further comprises at least first and second transistors, and
   wherein the mesh connecting the input and the output of the radiofrequency power limiter comprises, between the connection nodes of the drains of the first and second transistors, an intermediate inductor.

2. The radiofrequency power limiter according to claim 1, wherein the mesh connecting the input to the output of the limiter comprises at least one of:
   an input inductor between the input of the limiter and a connection node of the drain of an upstream transistor; and
   an output inductor between a connection node of the drain of a downstream transistor from among said at least one transistor and the output of the limiter.

3. The radiofrequency power limiter according to claim 1, wherein the gate of said transistor is connected to the common command potential (Voff), via a protection resistor.

4. The radiofrequency power limiter according to claim 1, wherein the drain of said transistor is directly connected to the mesh connecting the input and the output of the limiter.

5. The radiofrequency power limiter according to claim 1, wherein the source of said transistor is directly connected to the reference potential.

6. The radiofrequency power limiter according to claim 1, wherein the control potential (Voff) corresponds to a first terminal of a voltage source, the other terminal of the voltage source being connected to said reference potential.

7. The radiofrequency power limiter according to claim 6, wherein the voltage source is controlled by an adapted control signal.

8. The radiofrequency power limiter according to claim 1, wherein said transistor is a field effect transistor.

9. The radiofrequency power limiter according to claim 1 being made in a power technology, notably a technology based on gallium nitride.

10. A component of the low noise amplifier type, integrating a limiter according to claim 1.

11. A chain for transmitting or receiving radiofrequency signals including a limiter according to claim 1.

* * * * *